(12) United States Patent
Moschiano et al.

(10) Patent No.: US 9,087,594 B2
(45) Date of Patent: Jul. 21, 2015

(54) MEMORY APPARATUS, SYSTEMS, AND METHODS

(75) Inventors: Violante Moschiano, Bacoli (IT); Tommaso Vali, Sezze (IT); Giovanni Naso, Frosinone (IT); Vishal Sarin, Cupertino, CA (US); William Henry Radke, Los Gatos, CA (US); Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 422 days.

(21) Appl. No.: 13/563,314

(22) Filed: Jul. 31, 2012

(65) Prior Publication Data

US 2013/0058164 A1    Mar. 7, 2013

Related U.S. Application Data

(63) Continuation of application No. 13/219,439, filed on Aug. 26, 2011.

(60) Provisional application No. 61/620,636, filed on Apr. 5, 2012, provisional application No. 61/620,628, filed on Apr. 5, 2012.

(51) Int. Cl.
*G11C 11/34*    (2006.01)
*G11C 16/04*    (2006.01)
(Continued)

(52) U.S. Cl.
CPC ............ *G11C 16/26* (2013.01); *G11C 11/5628* (2013.01); *G11C 11/5642* (2013.01); *G11C 16/0483* (2013.01); *G11C 16/3418* (2013.01); *G11C 2211/5641* (2013.01)

(58) Field of Classification Search
CPC ............... G11C 16/26; G11C 11/5628; G11C 11/5642; G11C 16/0483; G11C 16/3418; G11C 2211/5641
USPC ............. 365/185.03, 189.09, 185.18, 185.19, 365/185.24, 185.25
See application file for complete search history.

(56) References Cited

U.S. PATENT DOCUMENTS 5,508,958 A    4/1996    Fazio et al.
7,463,514 B1    12/2008    Haque et al.
(Continued)

FOREIGN PATENT DOCUMENTS

| | | | |
|---|---|---|---|
| CN | 103843068 A | 6/2014 | |
| TW | 201324517 A1 | 6/2013 | |

(Continued)

OTHER PUBLICATIONS

"U.S. Appl. No. 13/219,439, Non Final Office Action mailed Jul. 28, 2014", 12 pgs.

(Continued)

*Primary Examiner* — Toan Le
(74) *Attorney, Agent, or Firm* — Schwegman Lundberg & Woessner, Inc.

(57) ABSTRACT

Threshold voltages in a charge storage memory are controlled by threshold voltage placement, such as to provide more reliable operation and to reduce the influence of factors such as neighboring charge storage elements and parasitic coupling. Pre-compensation or post-compensation of threshold voltage for neighboring programmed aggressor memory cells reduces the threshold voltage uncertainty in a flash memory system. Using a buffer having a data structure such as a lookup table provides for programmable threshold voltage distributions that enables the distribution of data states in a multi-level cell flash memory to be tailored, such as to provide more reliable operation. Additional apparatus, systems, and methods are provided.

26 Claims, 15 Drawing Sheets

(51) Int. Cl.
*G11C 16/26* (2006.01)
*G11C 11/56* (2006.01)
*G11C 16/34* (2006.01)

(56) References Cited

U.S. PATENT DOCUMENTS

| | | | |
|---|---|---|---|
| 7,577,034 | B2 | 8/2009 | Lee et al. |
| 7,684,237 | B2 | 3/2010 | Moschiano et al. |
| 7,800,951 | B2 | 9/2010 | Sutardja |
| 7,944,754 | B2 | 5/2011 | Cernea |
| 8,116,141 | B2 | 2/2012 | Yoo et al. |
| 8,451,664 | B2 | 5/2013 | Radke et al. |
| 2008/0253188 | A1 | 10/2008 | Aritome |
| 2008/0253193 | A1* | 10/2008 | Cernea .................. 365/185.19 |
| 2008/0273384 | A1* | 11/2008 | Sarin et al. ............ 365/185.03 |
| 2009/0073771 | A1* | 3/2009 | Li .......................... 365/185.22 |
| 2009/0106482 | A1 | 4/2009 | Sarin |
| 2009/0141558 | A1 | 6/2009 | Sarin et al. |
| 2009/0290426 | A1 | 11/2009 | Moschiano et al. |
| 2010/0149868 | A1 | 6/2010 | Yoo et al. |
| 2010/0265764 | A1 | 10/2010 | Yoo et al. |
| 2010/0321995 | A1 | 12/2010 | Sarin |
| 2010/0321999 | A1 | 12/2010 | Yoo et al. |
| 2011/0141815 | A1 | 6/2011 | Haratsch et al. |
| 2013/0033937 | A1* | 2/2013 | Aritome et al. ........ 365/185.22 |
| 2013/0051141 | A1 | 2/2013 | Moschiano et al. |
| 2013/0265827 | A1 | 10/2013 | Moschiano et al. |

FOREIGN PATENT DOCUMENTS

| | | |
|---|---|---|
| WO | WO-2010002941 A1 | 1/2010 |
| WO | WO-2011070599 A1 | 6/2011 |
| WO | WO-2013032928 A1 | 3/2013 |

OTHER PUBLICATIONS

"U.S. Appl. No. 13/219,439, Non Final Office Action mailed Dec. 20, 2013", 11 pgs.

"U.S. Appl. No. 13/219,439, Response filed Mar. 20, 2014 to Non Final Office Action mailed Dec. 20, 2013", 13 pgs.

"U.S. Appl. No. 13/219,439, Response filed Oct. 14, 2013 to Restriction Requirement mailed Sep. 13, 2013", 9 pgs.

"U.S. Appl. No. 13/219,439, Restriction Requirement mailed Sep. 13, 2013", 6 pgs.

"U.S. Appl. No. 13/563,283, Response filed Sep. 17, 2014 to Restriction Requirement Jul. 17, 2014", 7 pgs.

"U.S. Appl. No. 13/563,283, Restriction Requirement mailed Jul. 17, 2014", 6 pgs.

"International Application Serial No. PCT/US2012/052333, International Preliminary Report on Patentability mailed Mar. 13, 2014", 8 pgs.

"International Application Serial No. PCT/US2012/052333, International Search Report mailed Jan. 30, 2013", 3 pgs.

"International Application Serial No. PCT/US2012/052333, Written Opinion mailed Jan. 30, 2013", 6 pgs.

* cited by examiner

MEMORY APPARATUS, SYSTEMS, AND METHODS

RELATED APPLICATIONS

This U.S. Patent Application is a continuation of and claims the priority benefit of of currently-pending U.S. patent application Ser. No. 13/219,439, filed Aug. 26, 2011. This U.S. Patent Application also claims the priority benefit of U.S. Provisional Application Ser. No. 61/620,636, filed Apr. 5, 2012, entitled "Level Compensation in Multilevel Memory," and the priority benefit of U.S. Provisional Patent Application 61/620,628, filed Apr. 5, 2012, entitled "Memory Apparatus, Systems, and Methods." The contents each of these patent applications are incorporated by reference herein in their entirety.

BACKGROUND

A variety of computer systems and electronic devices use memory that does not lose the data it has stored when power is disconnected. These "nonvolatile" memories can be reprogrammed, read, and erased electronically, and are well suited to storing data such as music in digital audio players, images in digital cameras, and configuration data in cellular telephones. Such memory includes devices commonly known as flash memory, given this name because an entire block of cells may need to be erased at once before programming a portion of the block of cells. Flash memory is packaged for consumer use in products such as CompactFlash memory cards, USB flash memory drives, and other such devices.

Flash memory comprises a number of cells, each of which typically stores a single binary digit (or "bit") of data. A typical flash memory cell comprises a field effect transistor having an electrically isolated charge storage structure such as a floating gate or charge trap that controls electrical conduction in a channel region between the source and drain regions of the memory cell. Data is represented by a charge stored on the charge storage structure and the resulting change in conductivity observed in the channel region.

The charge storage structure separates a control gate from the source and drain regions of the memory cell. Electrons stored on the charge storage structure are insulated from the control gate and the drain and source by a dielectric structure, such as an insulating oxide layer. The stored electrons modify (i.e., partially cancel out) an electric field produced by the control gate; resulting in a change in the effective threshold voltage (Vt) of the memory cell. When the memory cell is read by placing a specified voltage on the control gate, current will flow or will not flow depending on whether the control gate voltage has a value above or below the threshold Vt of the memory cell. The presence or absence of current can be sensed and used to determine a programmed state of the memory cell, resulting in a particular data value such as a one or zero value being read.

More than a single bit of data can be stored in a flash memory cell by using multiple data states when performing programming (or writing) and reading operations. Flash memory cells used in this way are often referred to as multi-level memory cells. For example, a four-level memory cell is programmed to be in any one of four data states, thereby storing up to two bits of data per cell and doubling the amount of data that can be stored in the memory cell.

Memory cells are typically arranged in a two-dimensional array of rows and columns, where the rows are coupled via an access line, often called a word line, and the columns are coupled via a data line, often called a bit line. The word lines and bit lines are used during data read and write functions to either select certain memory cells for reading or to select certain memory cells for writing. During such read and write functions, factors such as induced electric fields, capacitive coupling, and resistance of the conductors can cause unwanted coupling or interference between the bit lines and word lines.

The memory cells themselves are further subject to the resistance and capacitance of the bit lines and word lines coupled to the memory cell for proper operation and communication with a memory controller. Device features, such as variation in the thickness of the dielectric layer between the charge storage structure and the channel region can also cause variations in the threshold voltage and other operating parameters of such a memory cell. Also, close physical proximity of memory cells in the memory array can result in coupling between charge storage structures, further influencing the operation of the memory cells. Factors such as these can be even more significant in multi-level flash memories having more than two potential data states per memory cell, as the difference between data states becomes harder to accurately discern as the number of different states increases.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the various embodiments of the invention, which is defined only by the appended claims.

Figure 1:
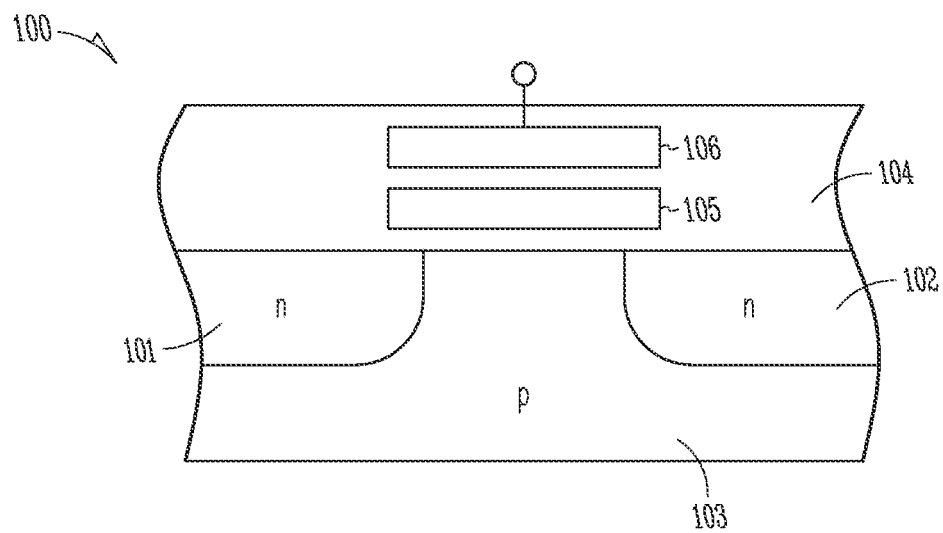
FIG. 1 is a cross-section view of a typical nonvolatile memory cell, as may be used to practice some embodiments of the invention.

FIG. 1 illustrates an example of a typical two-dimensional (2D) nonvolatile memory cell 100, which shares a basic structure with an electronically erasable programmable memory (EEPROM). A source 101 and drain 102 are formed in a p-type semiconductor material 103. (e.g., in a substrate of p-type silicon).

An example of semiconductor material is doped silicon. A dopant having five valence electrons such as phosphorous, arsenic, or antimony can be used to increase the electron concentration in the silicon or with a dopant having three valence electrons such as boron, gallium, indium, or aluminum to increase the hole concentration in the silicon. Dopants are typically added in small, controlled quantities to produce the desired hole or electron concentration in the semiconductor material, resulting in n-type material if a surplus of electrons are present, such as in the source 101 and drain 102, and resulting in p-type material if an excess of holes are present to create a p-type silicon substrate.

A dielectric material 104 (e.g., silicon oxide or SiO2) separates a charge storage structure (such as a floating gate 105 that can be fabricated from a conductor such as metal or conductive polysilicon) from a control gate 106 (that can be similarly formed of a conductive material) and the p-type semiconductor material 103. The floating gate 105 is not directly electrically coupled to another conductive element of the memory cell, but is "floating" in the dielectric material 104. The floating gate is separated from a channel region of the p-type substrate material 103 between the source 101 and the drain 102 by a thin insulative layer of controlled thickness (e.g., ten nanometers).

In operation, the floating gate 105 is able to store a charge due to its electrical isolation from other components of the memory cell. Programming or erasing a charge level on the floating gate 105 can be performed via a tunneling process known as Fowler-Nordheim tunneling, in which electrons tunnel through the dielectric layer separating the floating gate 105 from the substrate 103. Most flash memory cells are categorized as NOR flash or NAND flash, based on the arrangement of the memory cells.

To program a data bit to a NOR flash memory cell or store a charge on its floating gate, the source 101 can be grounded and a supply voltage such as six volts can be applied to the drain 102. In one embodiment, the drain voltage is applied via a bit line used to identify the bit to be written. A higher voltage such as 12 volts is also placed on the control gate 106, forcing an inversion region to form in the p-type substrate due to the attraction of electrons to the positively charged control gate. The voltage difference between the source and drain in combination with the inversion region in the p-type material result in significant electron flow between the source 101 and drain 102 through the p-type substrate 103's inversion region, such that the kinetic energy of the electrons and the electric field generated by the control gate voltage at 106 result in Fowler-Nordheim tunneling of high-energy or "hot" electrons across the insulator and onto the floating gate 105.

The floating gate thereby adopts a negative charge that counteracts any control gate positive charge's effect on the region of the substrate 103 between the source 101 and drain 102, raising the memory cell's threshold voltage that must be applied to the control gate 106 via a word line to result in conduction across an inversion region in the p-type substrate material 103. In other words, when the word line's voltage is brought to a high voltage such as five volts during a read operation, the cell will not turn on due to the higher threshold voltage as a result of electrons stored on the floating gate 105 during the write operation. The read voltage applied to the control gate is larger than the threshold voltage (Vt) of an erased memory cell, but not large enough to allow conduction across a substrate 103 inversion region of a cell that has been written.

To program or write a NAND flash memory cell, the source 101 and drain 102 of the memory cell of FIG. 1 can be grounded, and the control gate 106 can be brought to a voltage of perhaps 20 volts. This voltage is significantly higher than the 12 volt control gate voltage used to program the same memory cell using NOR flash methods, because a higher voltage makes up for the absence of "hot" electrons slowing between the source and drain of the memory cell.

To erase a memory cell using typical NOR flash memory circuitry, a similar tunneling of electrons can take place from the floating gate 105 to the source 101 of the memory cell. The source 101 is in some embodiments more deeply diffused than the drain to enhance erase performance. A positive voltage such as twelve volts can be applied to the source 101, the control gate 106 can be grounded, and the drain 102 can be left disconnected to perform an erase operation in one example. The large positive voltage on the source 101 attracts the negatively charged electrons, causing them to tunnel through the insulating layer 104 and leave the floating gate 105. Because there is very little current flow between the source and drain during an erase operation, performing an erase operation takes very little current and consumes relatively little power.

In another example memory cell erase operation often used in NAND memory configurations, the source 101 and drain 102 can be left floating, but the substrate material 103 can be brought to a high positive voltage such as 20 volts, attracting the negatively charged electrons and causing them to tunnel from the floating gate 105 through the dielectric layer 104 to the substrate material 103. This method is sometimes known as "channel erase," because the channel substrate material 103 receives electrons from the floating gate.

Figure 2:
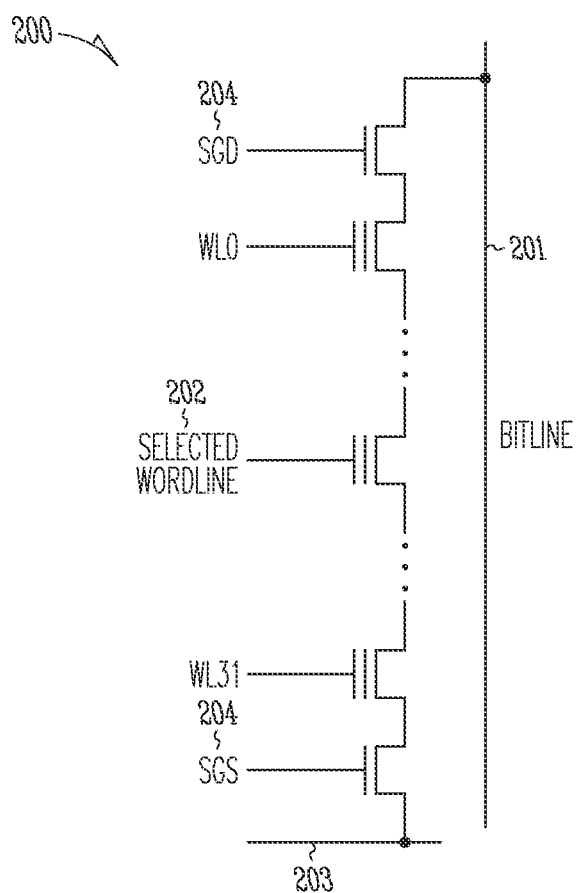
FIG. 2 is a schematic diagram of a portion of a NAND flash memory array coupled to a single bit line, consistent with some example embodiments of the invention.

As shown in FIG. 2, memory cells such as that of FIG. 1 are often arranged in arrays that are addressed via access lines known as word lines, and data lines known as bit lines. FIG. 2 shows a portion of a NAND flash memory array 200 coupled to a single bit line. This portion of the memory array can be referred to as a "string." The memory cells belonging to the string are selectable via the word line. The bit line 201 is coupled to a series of charge storage memory cells (e.g., memory cells 0-31 as shown) coupled to word lines 202 (e.g., WL0-WL31 as shown). The series of memory cells are connected on the other side of the series to source connection 203, and can be selectively isolated from the source connection 203 and bit line 201 by respective line select transistors 204.

To perform a read operation, the word line and therefore the control gate of the selected memory cell 202 can be maintained at a low but positive voltage level while the word lines of unselected memory cells can be brought to a sufficiently high voltage to cause the unselected memory cells to conduct irrespective of any charge that may be on the charge storage structures of the individual memory cells. If the selected memory cell has an uncharged charge storage structure it will activate as a result of the low positive voltage level on the control gate, but if the charge storage structure has a negative charge it will raise the threshold voltage of the memory cell 202 above the low positive voltage applied to the control gate such that the cell does not conduct. The state of the memory cell's charge storage structure can therefore be determined by monitoring conductivity or current flow between the bit line 201 and source line 203.

To perform a write operation, the bit line 201 and source line 203 are typically grounded via line select transistors 204 coupling the string to a grounded bit line 201 and source line 203. The gates of select transistors 204 are therefore again coupled to a voltage source such that the transistors conduct. The control gates of the memory cells not being written are brought to a sufficiently high voltage to cause the memory cells to conduct irrespective of their stored charges, such as ten volts. The selected memory cell 202's control gate is coupled to a significantly higher voltage (e.g., 20 volts). The voltage applied to the selected memory cell's control gate causes formation of an inversion region in the channel and tunneling of electrons due to the attraction of electrons to the positively charged control gate coupled to the higher voltage signal. The grounded source and drain in combination with the inversion region in the channel material provide a continuous source of electrons for tunneling in the memory cell's inversion region, such that electrons that tunnel onto the charge storage structure can be replaced by electrons from the grounded bit line and source lines.

As electrons tunnel through the dielectric layer onto the charge storage structure, the charge storage structure's initial positive potential due to electric field coupling with the control gate reduces, thereby reducing the voltage difference between the charge storage structure and the channel region and slowing the tunneling of electrons onto the charge storage structure.

Storage of electrons on the charge storage structure 105 of FIG. 1 is somewhat self-limiting, and is determined by factors such as electric field coupling between the control gate 106 and charge storage structure 105, thickness and type of the dielectric material 104 between the various components, variations in word line voltage or bit line voltage, and stray electric fields or capacitance with other elements of the memory circuit. The resulting variation in charge storage structure charge results in variation in the threshold voltage (Vt) of programmed memory cells, which is undesirable due to the effect on reliability of variation in separation of Vt distributions.

Programming of the charge storage structures of neighboring memory cells can also inadvertently change the functional Vt of a memory cell, particularly if several neighboring cells are also programmed. When combined with other factors, such as capacitive coupling, temperature fluctuations, program/erase cycling, and storage of multiple bits of data per memory cell, the influence of neighboring charge storage structure can cause a cell to later be misread. The influence is strongest for cells that are physically near a cell to be read or programmed, such as cells within one cell's distance in any direction from the cell being read or programmed.

Figure 3:
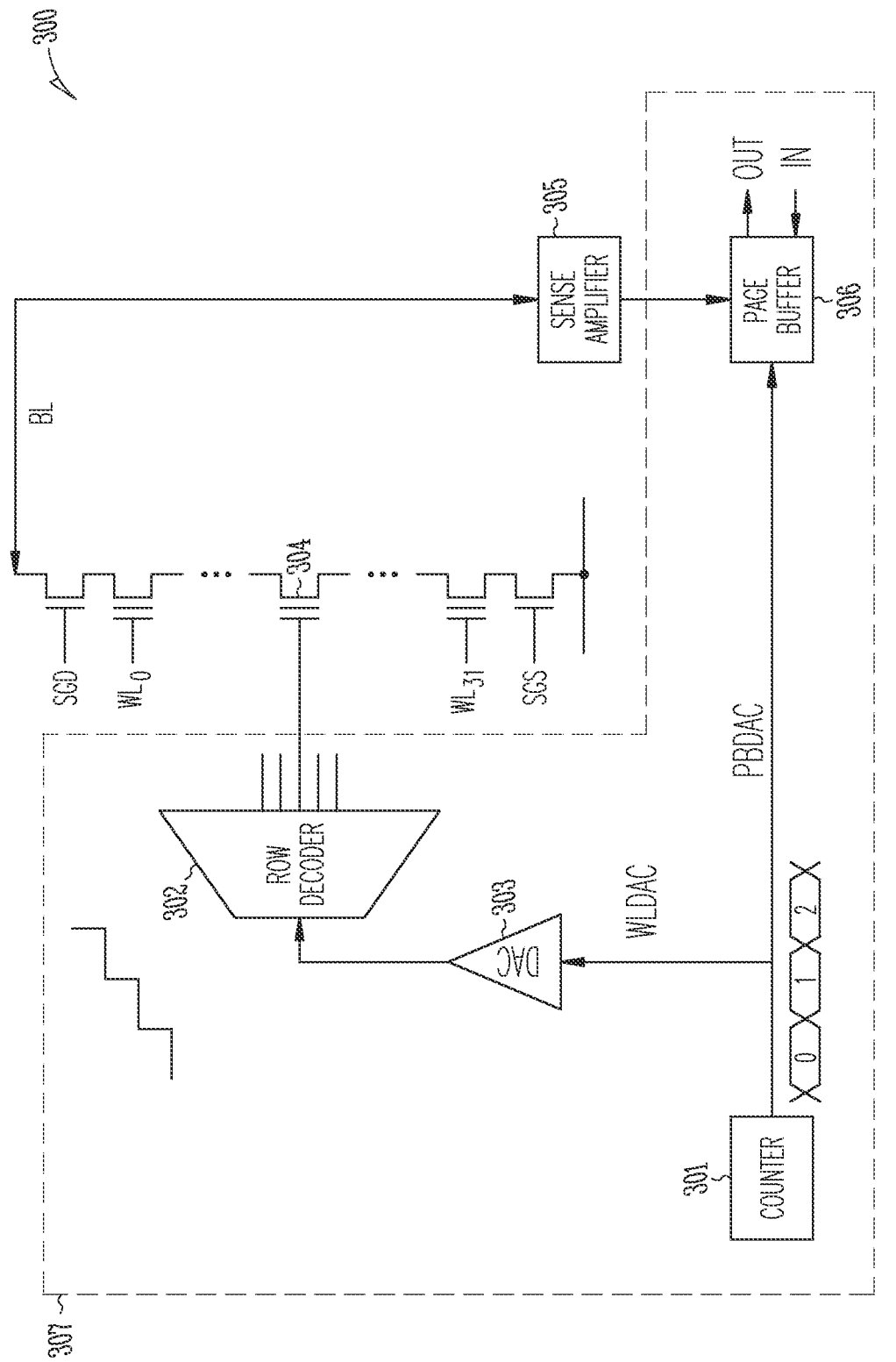
FIG. 3 is a schematic diagram of an example of a system that detects a threshold voltage of a memory cell, consistent with some example embodiments of the invention.

Typical flash memories use a comparator as part of the read logic coupled to a bit line to determine whether Vt of a memory cell is above or below a certain voltage value. FIG. 3 shows a block diagram of an example of an alternate system 300 to detect the actual value of the Vt of a memory cell (see for example, U.S. Publication No. 2009/0141558A1). Here, a counter 301 generates a progressive sequence of numbers that are provided to a digital-to-analog converter (DAC) 303 via the bus signals WLDAC (Word line DAC) and to a page buffer 306 via the bus signals PBDAC (Page Buffer DAC). In the example shown in the Figure, the signals WLDAC and PBDAC are the same. The DAC 303 generates a voltage ramp signal that is provided to a selected word line via the row decoder 302. When the memory cell 304 being read conducts, the sense amplifier 305 detects the conduction of the memory cell. The value of the counter 301 is latched into the page buffer 306; thereby determining a digital value associated with the Vt of the memory cell 304 being read. The page buffer 306 can provide this digital value to output pads via the OUT signal. As an illustrative example, if the conduction of the memory cell happens at the voltage ramp step corresponding to a counter value of '79' and the DAC resolution is forty millivolts (40 mV), the detected Vt is 79*40 mV=3.16V. The system 300 can be used not only for a read operation but also for programming a specific voltage threshold in the selected memory cell 304. In alternate embodiments, other methods of providing a similar function or result are employed, such as using an analog voltage ramp generator and converting the analog signal provided to the read logic to a digital value using an analog to digital converter. The digital converter value is the digital value associated with the Vt of the memory cell 304.

Figure 4:
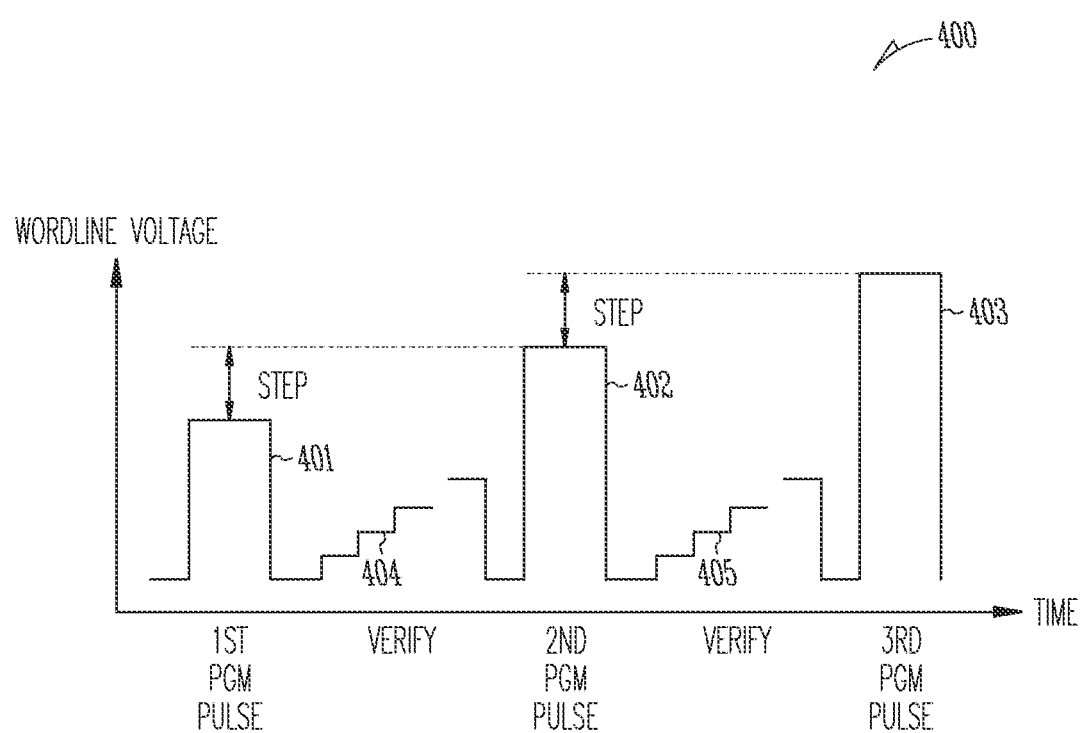
FIG. 4 shows a representation of an example of a waveform that can be used to perform a programming operation, consistent with some example embodiments of the invention.

FIG. 4 shows an example of a word line (WL) waveform 400 that can be used to perform the programming operation. The programming can be performed by programming logic of a memory system. The waveform 400 can include a programming pulse signal generated by a programming signal source. The waveform can include a series of increasing high voltage amplitude pulses 401, 402, and 403 applied to a control gate of the memory cell to be programmed. The waveform also includes low voltage ramps 404 and 405 to perform read or verify operations to determine if the threshold voltage of the selected cell 304 is substantially equal to the desired value. The page buffer 306 of FIG. 3 includes the same number of latches as the number of bits of the counter (e.g., the same number of latches as the number of bits as bus signals WLDAC and PBDAC), and the digital representation of the target value of the threshold voltage to be programmed in the selected memory cell 304 can be loaded into the page buffer latches via the input pads (IN) of the system.

Returning FIG. 4, after a specific programming pulse (e.g., 401) is applied to a memory cell, a verify operation of the memory cell threshold voltage is performed. Read logic may perform the verify operation by applying the voltage ramp (e.g., 404) to the memory cell. If the sense amplifier 305 indicates that the memory cell is conducting at the ramp step corresponding to the value stored into the latches of the page buffer, the cell threshold voltage is still lower than desired and the page buffer 306 continues to apply a voltage value of zero volts (0V) to the bit line (BL) to program the cell. If the memory cell is not conducting at the ramp step corresponding to the value stored into the latches of the page buffer, the cell threshold voltage reached the desired value. The programming pulse signal can be decoupled from the control gate of the memory cell, and the page buffer can apply a voltage bias to prevent the cell programming (cell inhibition) to the bit line BL.

At the next program pulse (e.g., 402), the selected memory cell will be programmed using a slightly higher Vt or programming will be inhibited according to the results of the previous verify operation. The WL waveform example shown in FIG. 4 can be applied until reaching maximum programming voltage on the WL and before that maximum value is reached the selected cell Vt will have been placed at the desired threshold voltage value. With the system 300 of FIG. 3, the user can read the exact threshold value of a memory cell and can provide the exact threshold value to be programmed in a selected memory cell. For this reason the system 300 can be also called a "Vt placement" system, and the circuitry included in the Figure can be referred to as voltage placer circuitry 307.

The ability to differentiate between different threshold voltages using a memory system such as system 300, rather than merely determining if the threshold voltage is above or below a certain voltage value, facilitates not only more accurate determination of a cell's data state, but in various embodiments can be used for multi-level memory cell reading and compensation for neighboring programmed memory cells, error correction estimation, and other such functions.

Figure 5:
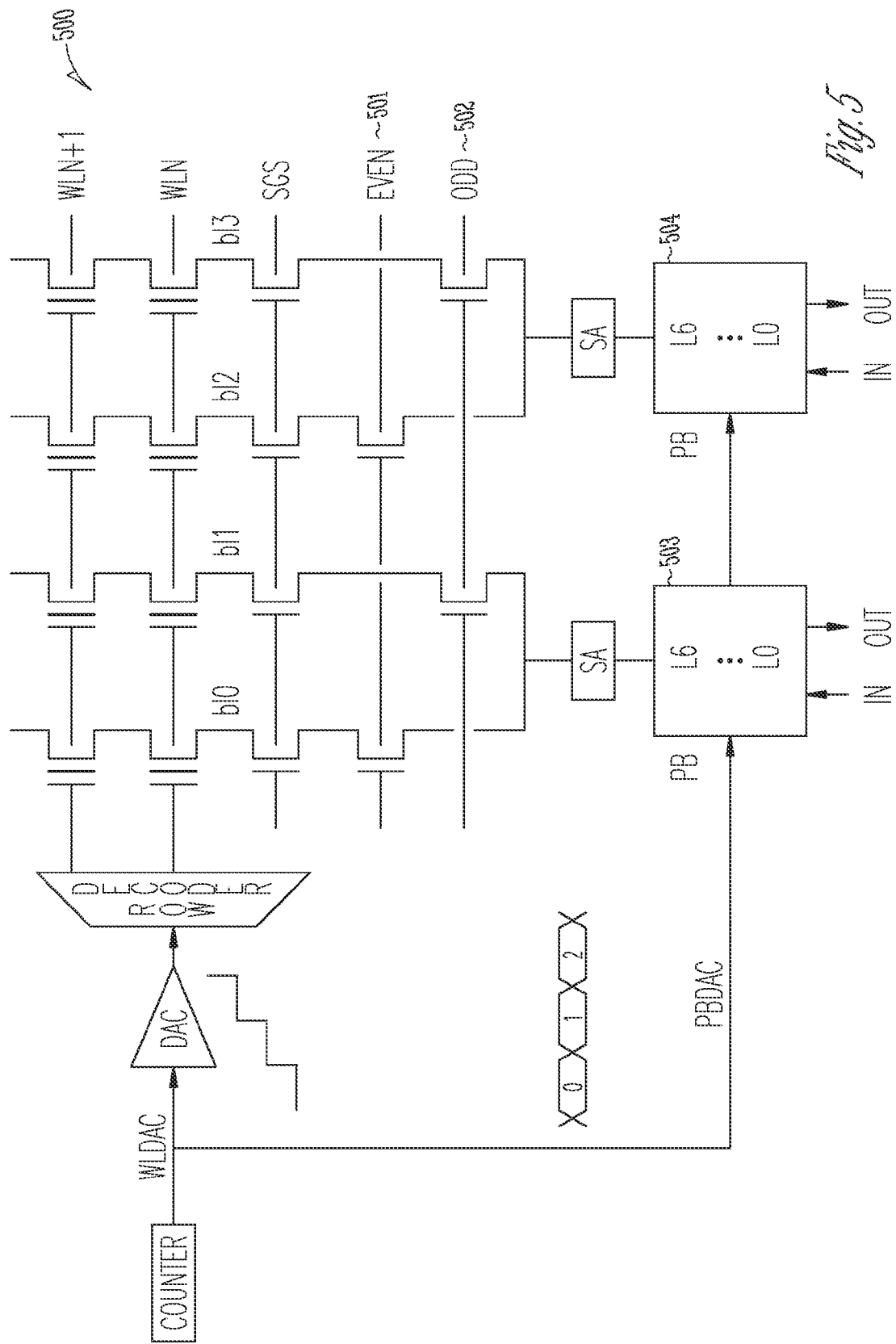
FIG. 5 is a schematic diagram of another example of a system that detects a threshold voltage of a memory cell, consistent with some example embodiments of the invention.

FIG. 5 shows a block diagram of another example of a system 500 to detect the actual value of the Vt of a memory cell. The example shown expands upon the example shown in FIG. 3 by providing more details about the organization of multiple NAND strings. The system 500 includes two seven-bit page buffers. For layout optimization, each page buffer is associated with an 'even' string and an 'odd' string. Page buffer 503 is associated with even string b10 and odd string b11, and page buffer 504 is associated with even string b12 and odd string b13. The even and odd strings, also referred to as even and odd pages, can be alternatively accessed for program and read using the even and odd line select transistors coupled to even select signal 501 and odd select signal 502. All the memory cells driven by a particular word line and selected by the even/odd select line transistors are in this example defined as a page of 8 kBytes. The data stored in each memory cell comprises seven bits of data, as shown by the page buffers 503 and 504.

Figure 6:
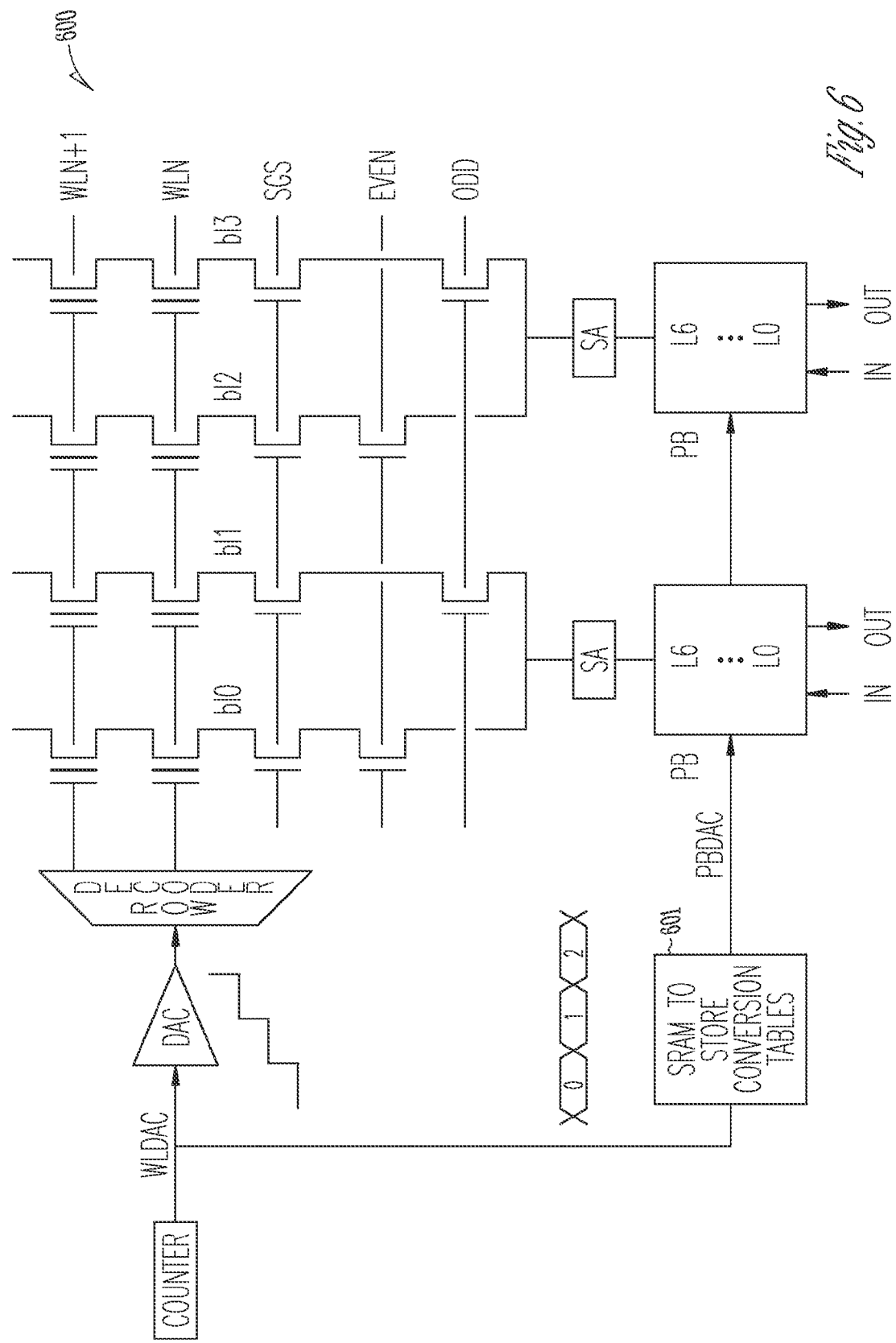
FIG. 6 is a schematic diagram of still another example of a system that detects a threshold voltage of a memory cell, consistent with some example embodiments of the invention.

FIG. 6 shows a block diagram of still another example of a system 600 to detect the actual value of the Vt of a memory cell. The example of FIG. 6 modifies the example of FIG. 5 to include an element such as a static random access memory (SRAM) 601 that stores a conversion table. The purpose of the conversion table is to decouple signals WLDAC and PBDAC and allow PBDAC coding different from a linear value progression, allowing the voltage increment to be non-linear. The decoupling of the WLDAC and PBDAC signals allows for programming (or writing) and reading data in the already mentioned "Vt placement style" but also allows for programming and reading in "data placement style." In data placement, bits of data can be entered (e.g., by a user) without regard to an associated Vt value. This is because the system 600 will internally provide proper Vt allocation using the SRAM. As an illustrative example, for a counter having eight components and page buffers having seven latches, the basic structure of SRAM to store a single conversion table will have $2^8$=256 rows and 7 columns.

Figure 7:
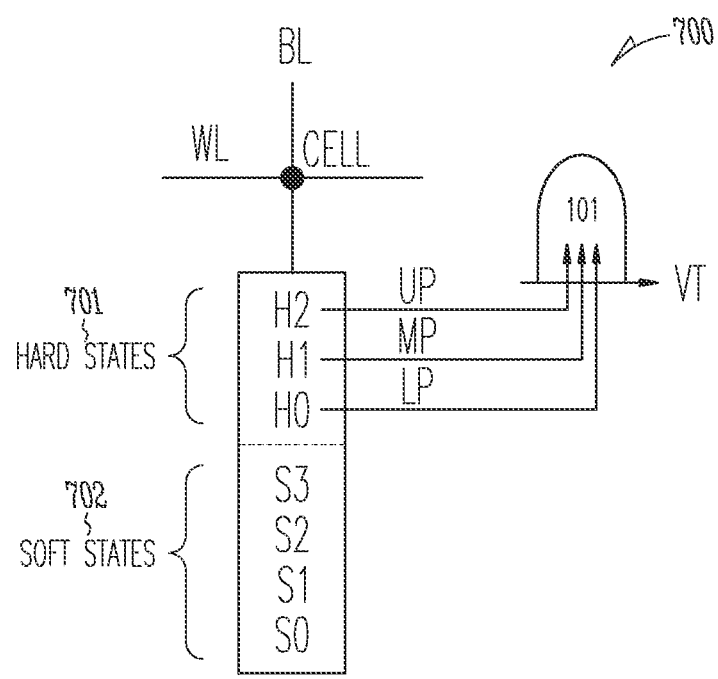
FIG. 7 is a representation of a seven bit page buffer, consistent with some example embodiments of the invention.

FIG. 7 shows a more detailed representation of a seven-bit page buffer 700. Here, Three "hard bits" 701 (H2, H1, H0) of data, or hard states, are stored and used to encode one of eight different data states of a memory cell. The remaining four "soft bits" 702 (S3, S2, S1, S0), or soft states, can be used for many purposes. The soft states can be used during read operation to retrieve information about how far each cell's Vt is from the center of the Vt distribution. Soft states can also be used to store information related to neighbouring aggressor cells for compensation during program operations. A neighbouring aggressor cell is a cell that when programmed can potentially influence the threshold voltage of the memory cell one is interested in programming or reading. The soft bits can be used to store information that quantifies the influence on the threshold voltage.

The influence exerted by one or more adjacent aggressor programmed memory cells can result in a change in observed threshold voltage of a cell as a result of the programmed state of the one or more adjacent aggressor programmed memory cells. Voltage placer circuitry, such as shown in the examples of FIGS. 3, 5, and 6, can be used to adjust a threshold voltage of a memory cell to compensate for the influence due to one or more adjacent aggressor programmed memory cells in achieving a desired threshold voltage. The voltage placer circuitry programs a memory cell to one or more programmable or configurable threshold voltages. For example, the soft bits may indicate that the influence of the aggressor memory cells contribute 80 mV to the voltage threshold of the cell to be programmed. If the target voltage threshold is 3.0V, the memory system can use the soft bit information to the voltage threshold to 2.92V.

Threshold voltage tracking can be used to estimate a probability or likelihood of influence from neighboring memory cells, and the estimate can be employed to provide error correction during a read operation. For example, when a memory cell being read conducts, the value of the counter is used to determine a digital value associated with the Vt of the memory cell. The influence of aggressor cells may cause the memory cell to conduct too soon. The soft bits can be used to indicate a probability that the digital value read assuming no influence from aggressor cells may be incorrect. Thus, the soft bits may provide an error correction circuit (ECC) with information that may help resolve errors that could otherwise not be corrected.

Hard bits and soft bits can be managed as a single page of memory using external circuitry. If for example the memory cells are configured as a page that is 8 kBytes of memory cells long, all the lower significant bits (e.g., lower 3 bits) of the code will be written and read by the external circuitry as a single 8 kByte page (Lower Page—LP). The same can apply to the medium significant bits (Medium Page—MP) and for the most significant bits (Upper Page—UP). The programming operation can be performed in sequential order starting with the LP first, then the MP, and ending with the UP. If for example in a memory configured as 3 bits per memory cell and the LP and MP have been already programmed, the user needs to provide only bits of the UP. The MP and LP to restore the complete 3 bits information per cell to be associated with the Vt value are internally read by the memory control circuitry before a programming operation begins.

Figure 8:
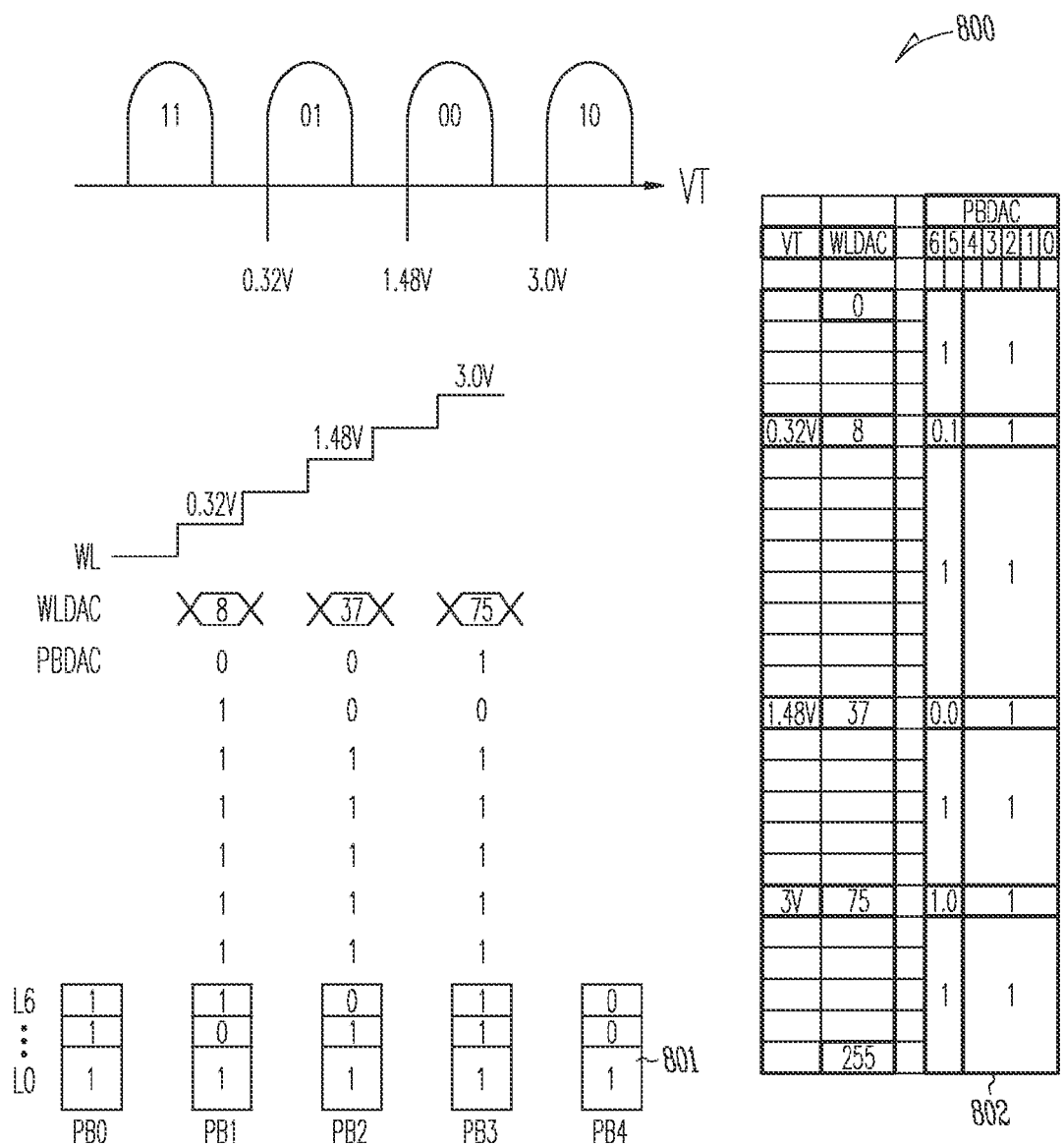
FIG. 8 shows an example of a conversion table used for a program operation, consistent with some example embodiments of the invention.

FIG. 8 shows an example 800 of using a conversion table 802 (e.g., as stored in SRAM 601 in FIG. 6) to perform a "data placement style" program operation. In the example, a memory cell stores 2 bits of data and the LP has been already programmed. All the page buffers 801 are reset to all 1's at the beginning of the programming. The UP page data (11010 . . . ) is entered (e.g., by a user or programming logic)

that will be stored as hard states H3 in the latches L6 (of the seven latches L6, L5 ... L0) of the page buffers (PB0, PB1, PB2, PB3, PB4 ... ). The program command may be confirmed after storing the L6 data. The memory system performs an internal reading of the LP and stores the read bits (10110 ... ) as hard states H2 in latch L5 of each page buffer. At this phase of the program operation, the page buffers contain the complete information to place the 2 bits per cell distributions (11, 10, 01, 11, 00 ... ). The memory system may then internally load the conversion table 802 to perform the programming. The conversion table 802 may have all its 256 rows filled with ones with the exception of the three rows 8, 37, and 75, which may be filled with the hard bits associated with the distributions 01, 00, 10. The specific row address or addresses to fill with a hard state (HS) are internally set into the memory and determine which voltage value is to be associated to each specific distribution. In some embodiments, these row addresses can be stored in non volatile special NAND flash locations (often referred to as "fuses") that can be changed in test mode in the factory to optimize the distributions placement.

During each program verify phase, the counter performs a scan from 0 to 255 (the size of the conversion table). The voltage on the word line WL is progressively stepped (e.g., steps of 40 mV) from 0V to the maximum voltage value. At each ramp step, the value of PBDAC is compared to the content of all of the page buffers. If there is a match different from 1111111, a sensing operation is performed to expose the memory cell to a subsequent program pulse or to inhibit programming of the cell for the remainder of the programming operation.

In contrast to the Vt placement approach, use of a conversion table allows flexible management of the hard and soft data. As an example, consider the use of 2 HS to place distributions according to the Vt placement style in the example of FIG. 5. In this example, threshold voltage distributions are allocated using the codes 00, 01, 10, 11 that correspond to threshold voltages 0011111=1.24V, 0111111=2.52V, 1011111=3.8V, and 1111111=5.08V. The hard bits of data can comprise the most significant bits of a threshold voltage representation in the conversion table, and the one or more soft bits of data can comprise the least significant bits of the threshold voltage.

The use of the conversion table in the example of FIG. 6 allows the four Vt distributions to be allocated with any code (e.g., 11, 01, 00, 10) and the associated Vt's can be internally set internally to any distribution with the possibility of non-uniform spacing between the distributions.

The conversion table converts a value of a digital signal corresponding to the analog ramp signal to a converted digital value. The converted digital value is applied to the page buffer to store the target threshold voltage to be programmed. Thus, using the conversion table provides a configurable distribution between threshold voltages in the memory cell to be programmed. Although the example 800 in FIG. 8 refers to program verification of UP using two bits of data per cell memory, the technique of a data placement style program operation is also intended to be applicable to configurations of different page sizes and different bits per memory cell.

Figure 9:
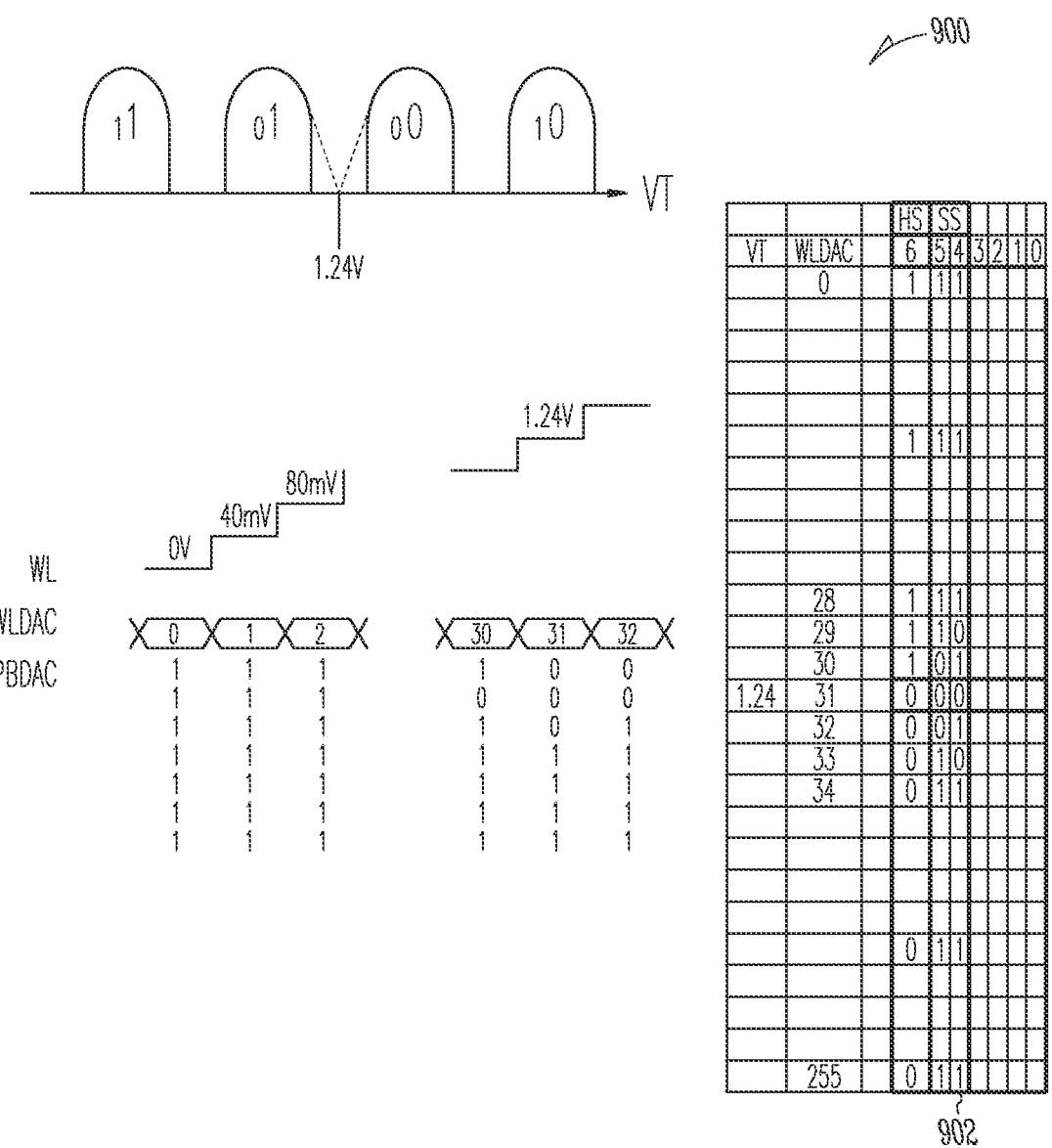
FIG. 9 shows an example of a conversion table used for a read operation, consistent with some example embodiments of the invention.

FIG. 9 shows an example 900 of using a conversion table to perform a data placement style LP read operation. In the example, a lower page LP is read in a flash memory configured as 2 bits per cell. An LP read operation command is received after which the counter starts to count from 0 to 255; thereby generating a word line stepped voltage ramp and progressively addressing rows of the conversion table. At each step of the ramp, a sensing operation is performed, and if a cell does not conduct, the content of the addressed row of the conversion table 902 is stored into the page buffer corresponding to that cell.

In the example 900, the content of the addressed row of the conversion table 902 includes a single hard hit or hard state HS and multiple soft bits, or soft states SS (2 SS in this example). The HS is 1 for cells having Vt below 1.24V and is 0 for cell having Vt above 1.24V. The SS are used to provide information about the Vt distribution of the cell. The SS are 11 if the Vt of the cell is far from the edge and are 10, 01 if the cell is at an edge of the distribution. The SS can be associated to the specific page being read, and thus the SS can be referred to as being retrieved by page. After the ramp has been completely scanned, the 8 kBytes of HS can be read out (such as by a command). The 8 kBytes associated to the first SS can be read out using a specified command or another specified command can be used to read out the 8 kBytes associated to the second SS. Although the example 900 refers to reading the LP of system having two bits per memory cell, the technique of a data placement style read is also intended to be applicable to configurations of different page sizes and to different bits per memory cell.

Figure 10:
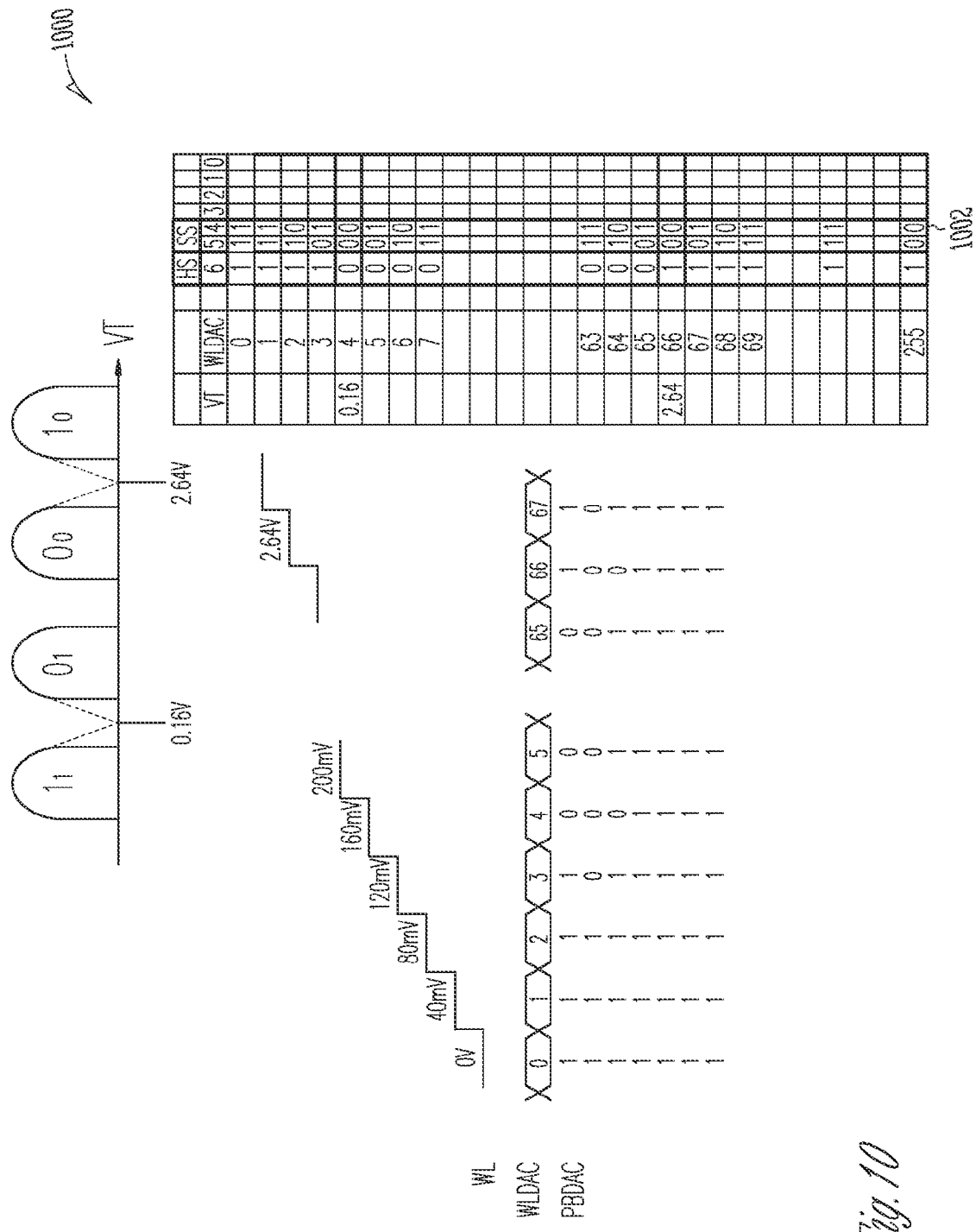
FIG. 10 shows an example of a conversion table used for another read operation, consistent with some example embodiments of the invention.

FIG. 10 shows an example 1000 of using a conversion table 1002 to perform a data placement style upper page UP read operation. In the example 1000, an upper page UP in a flash memory is configured as 2 bits per memory cell. An upper page UP read operation command is received, after which the counter starts to count from 0 to 255; thereby generating a word line stepped voltage ramp and progressively addressing rows of the conversion table. At each step of the ramp, a sensing operation is performed, and if the cell does not conduct, the content of the addressed row of the conversion table 1002 is stored into the page buffer corresponding to that cell.

In the example 1000, the content of the addressed row of the conversion table 1002 includes a single HS and two SS. The HS is 1 for cells having Vt below 0.16V and above 2.64V, and is 0 for cells having Vt within these two voltage values. The SS are 11 if the cell is far from the edge of the distribution, and are 10 or 01 if the cell is at the edge of the distribution. The SS can be retrieved by page. After the ramp has been completely scanned, the 8 kBytes of HS can be read out (such as by a command). The 8 kBytes associated to the first SS can be read out using a specified command or another specified command can be used to read out the 8 kBytes associated to the second SS. The content of the conversion table 1002 used to read the UP can be set internally in the memory system as fuses and the conversion table can be loaded under supervision of an internal controller in the initialization phase after power up. These fuses can be changed in test mode at the factory to optimize the distributions retrieval. Although the example in FIG. 10 refers to reading the UP of system having two bits per memory cell, the technique of a data placement style read is also intended to be applicable to configurations of different page sizes and to different bits per memory cell.

The content of the LP and UP conversion tables can be dynamically altered by the internal controller in order to perform optimization in the data retrieval to account for distribution alteration due to cycling, charge loss, charge gain, aggression from neighbouring cells. The content for the LP and UP conversion table can be also dynamically altered by an external controller, via a fast protocol, to perform optimizations in the data retrieval based on external data management such as error correction coding (ECC).

Figure 11:
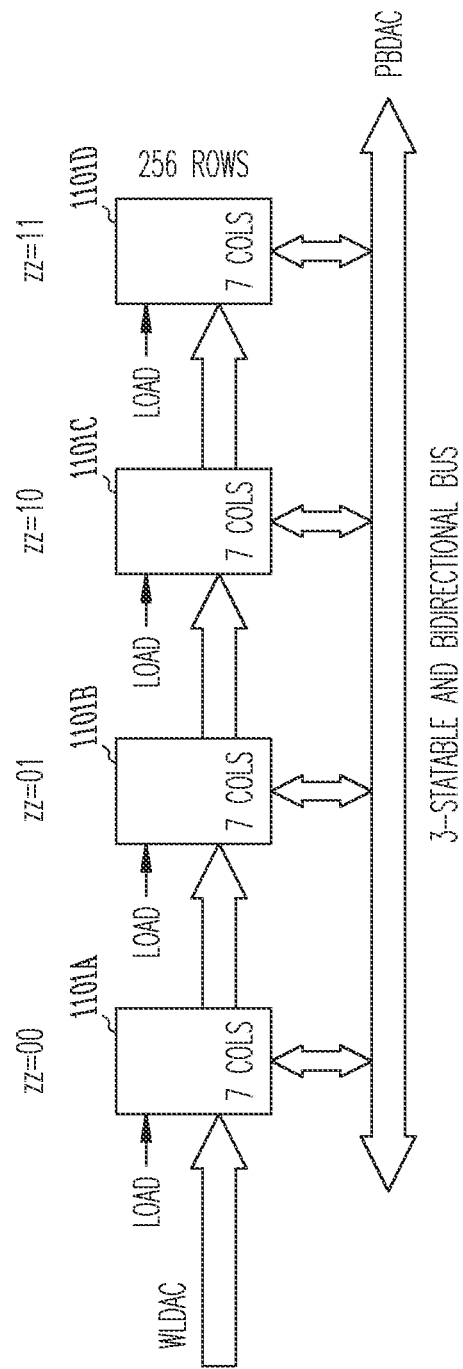
FIG. 11 shows an example of using SRAM to provide multiple conversion tables, consistent with some example embodiments of the invention.

FIG. 11 shows an example 1100 of using SRAM to provide multiple conversion tables. The example shows an arrangement of 4 SRAM modules 1101A, 1101, B, 1101C, 1101D that allocate 4 conversion tables (e.g., one conversion table for programming memory cells, and three conversion tables for reading the UP, MP, or LP). The four SRAM modules 101A-D may have a common WLDAC bus to scan the 256 row address of the conversion tables. The PBDAC output can be a bi-directional tri-statable bus common to the four SRAM modules. Each one of the SRAM modules can be selected via the select bus (shown as zz) and only the selected SRAM module will be enabled to drive the output PBDAC bus. The selected SRAM module can be set up using the common signal "load" (e.g., load=1) to load the HS and/or SS bits by either an internal controller or an external controller. If load is inactive (e.g., load=0), the selected SRAM module is enabled to provide PBDAC values to perform a read or verify operation.

Figure 12:
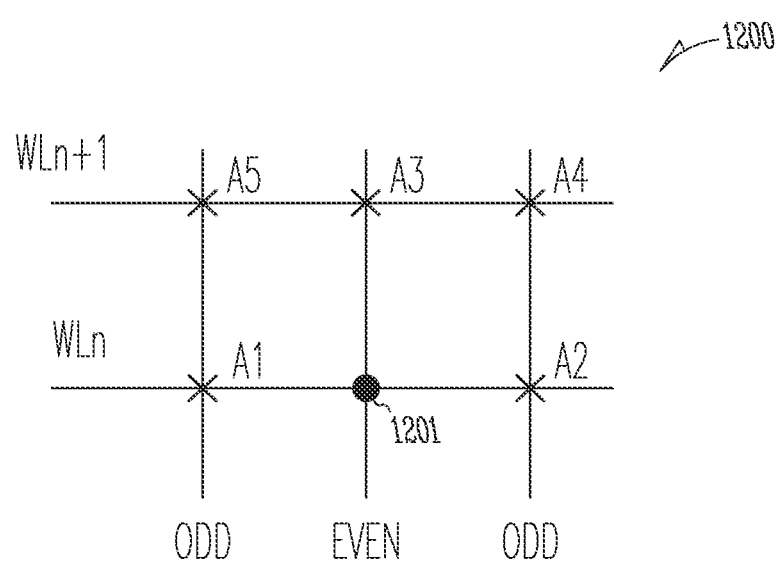
FIG. 12 shows a representation of an example of a memory cell and neighboring potential aggressor cells, as may be used to practice some embodiments of the invention.

FIG. 12 shows a representation 1200 of an example of a memory cell 1201 with neighbouring potential aggressor cells A1-A5. The cell 1201 in this embodiment is potentially affected by programming of neighbour cells, including cells A1 and A2 to its side but in different page, neighbour cell A3 which is in the same page but on a neighbouring word line, and neighbour cells A4 and A5 which are both on a neighbouring word line and a different page. Here, the neighbouring cells A1, A2, and A3 have charge storage structures that are nearer to the charge storage structure of the cell 1201, and so programming of those cells has a greater influence on the threshold voltage of cell 1201 than programming of the other neighbouring cells A4 and A5. For this reason cells A4 and A5 are not included in the example of the pre compensation and post compensation, as the influence of programming those cells on cell 1201's threshold voltage is low. If the desired threshold voltage of 1201 is 3V, for example, and programming neighbouring cells A1, A2, A3 contributes approximately 300 mV in total to the threshold voltage observed when reading cell 1201, cell 1201 can be programmed to a target threshold voltage of approximately 2.7V so that it will have an observed threshold voltage closer to the desired 3V after the cells A1, A2, A3 are programmed.

Figure 13:
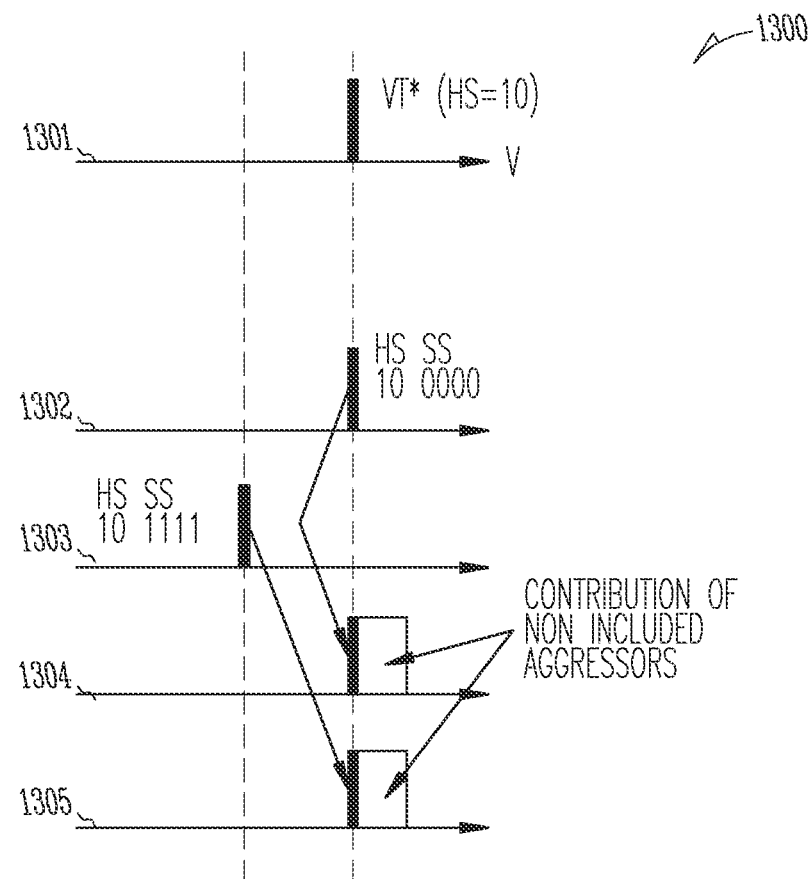
FIG. 13 shows an example of a timing diagram useful to describe the technique of threshold voltage pre-compensation, consistent with some example embodiments of the invention.

FIG. 13 shows a timing diagram 1300 used to describe the technique of threshold voltage pre-compensation in greater detail. The technique is referred to as pre-compensation because knowledge of the neighbouring cells is used before the memory cell is programmed. The timing diagram 1300 illustrates how a desired threshold voltage Vt. (shown at 1301) is achieved by using a hard state (HS) programmed voltage (shown at 1102) with soft state (SS) compensation during programming.

As in the example of FIG. 4, programming is performed by providing a series of programming pulses to the control gate of the memory cell to be programmed, and performing a read operation between programming pulses to determine whether the threshold voltage is substantially equal to the desired target threshold voltage. Once the desired threshold voltage is reached, the programming pulse signal can be decoupled from the control gate of the memory cell, halting further programming of the cell. Hard bits are used to encode a target threshold voltage corresponding to the desired data state of the cell to be programmed, while soft bits are used to compensate for aggressor memory cells nearby. For example, the soft bits can encode the difference between the desired target threshold voltage and the threshold voltage actually programmed into the memory cell.

Suppose that a set of memory cells is to be programmed with hard data expressed by HS=10 and that the target threshold voltage value associated to this data is VT* as shown at 1301. It is desired that the pre-compensation type memory system set the voltage threshold of the cells as close as possible to the value VT* no matter what value their neighbouring cells will be programmed to in the future. The target threshold voltage is based at least in part on the determined target data state of any potential aggressor memory cells. The pre-compensation type memory system identifies those memory cells that will not be subject to cell aggression because their neighbouring cells will not be programmed during the program operation. The SS bits for these non-aggressed cells are given a value (e.g., SS=0000) that indicates that the cells are immune from aggression, and the cells will be programmed substantially equal to the final target vale VT* as shown at 1302. The pre-compensation memory system also identifies cells that will be aggressed because the neighbouring cells will be programmed. The SS bits for these aggressed cells are given a value (e.g., 1111) that indicates that the cells are subject to aggression, and the cells are exposed to aggression, and the cells will be programmed at a proper level below the target value VT* as shown at 1303.

After all the neighbouring cells are programmed, the threshold voltage of the non aggressed cells remains at the target value VT*, as shown at 1304. The observed threshold voltage of the aggressed cells will move to the final target value VT*, as shown at 1305. The pre-compensation technique is precise in allocating Vt's at the target value VT* if all the aggressors are accounted for in the aggression evaluation (e.g., from the side word line, from both side bit lines, and from the diagonal). If, such as for simplification reasons, some of the neighbouring aggressors are not included in the aggression evaluation, there may be an approximation in the placement of Vt around VT*. Aggressor compensation reduces the level of uncertainty in threshold voltage as a result of neighboring programmed memory cells. This can be used to provide more data states or more bits of data per cell, reduce the number of read errors in a memory, or otherwise improve memory performance.

In some examples, programming logic can load the desired page or pages of memory into the hard bit locations of an buffer such as an SRAM or page buffer, and the soft bits can be determined from the hard bits using a lookup table and written to the buffer such as by sequentially scanning the memory cells and deriving soft bit data from neighboring cells. The buffered page data can then be written to the memory pages, including both the hard bit data and soft bit compensation data. Programmable threshold voltages can be used to provide a greater percentage of change in voltage from threshold voltage to threshold voltage in a multi-level cell flash memory.

Figure 14:
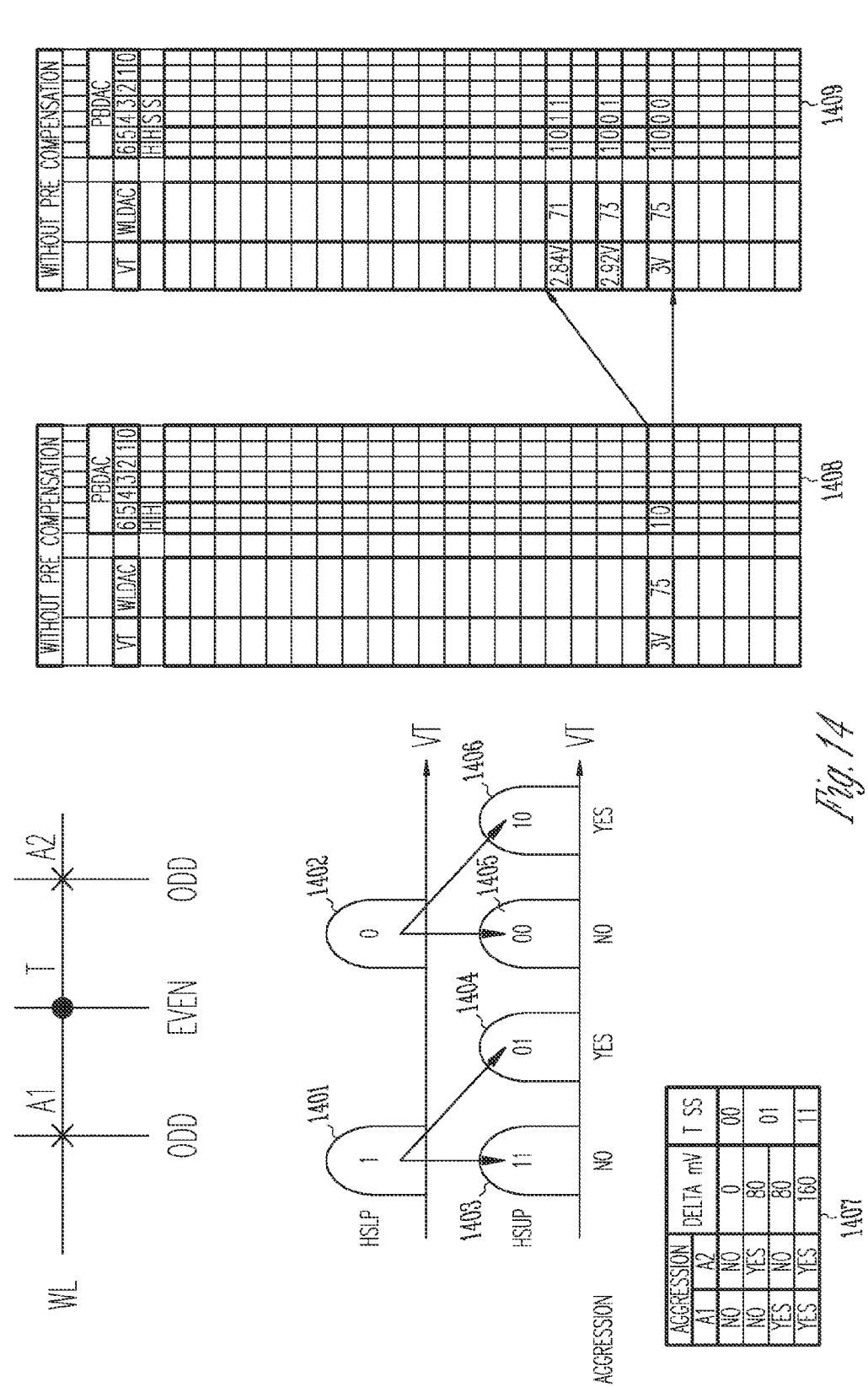
FIG. 14 shows an example of programming a memory system using voltage threshold pre-compensation, consistent with some example embodiments of the invention.

FIG. 14 shows an example 1400 of pre-compensation of an even upper page UP program performed on a memory system that is configured as 2 bits per cell. The even target memory cell T can be programmed with different voltage values according to whether or not the two neighbouring odd cells A1 and A2 on the same word line WL will be programmed. Aggression from neighbouring cells other than A1 and A2 are not included in the example. The odd upper page UP will be programmed after the even upper page and for this reason the subsequent odd upper page programming operation can induce interference on the programmed even upper page. To minimize the floating gate to floating gate interference between memory cells, the program sequence can include previously programming the odd lower pages LP in the cells such as the LP of cells A1 and A2. Cells A1 and A2 may be either in position 1401 corresponding to hard state 1 (HS LP=1) or in position 1402 corresponding to hard state 0 (HS LP=0).

When the odd upper page is programmed, the original odd lower page voltage threshold distributions can have one of the transitions shown in the Figure. The transition from position 1401 to position 1403 corresponds to LP hard state 1 (HS LP=1) to programming UP hard states 11 (HS UP=11). For this case there is no Vt shift and no disturb on even cell T. The transition front position 1401 to position 1404 corresponds to LP hard state 1 (HS LP=1) to programming UP hard states 01 (HS UP=01). For this transition there will be a shift in Vt that will induce a disturbance on even cell T. The transition from position 1402 to position 1405 corresponds to LP hard state 0 (HS LP=0) to programming UP hard states 00 (HS UP=00). For this case there will be a shift in Vt that will induce a disturbance on even cell T. The transition from position 1402 to position 1406 corresponds to LP hard state 0 (HS LP=0) to programming UP hard states 10 (HS UP=10). For this transition there will be a shift in Vt that will induce a disturbance on even cell T.

Assume that the final target threshold voltage value Vt is 3.0V. As shown in Table 1407, the different levels of aggression can be coded using two soft bits in the target cell page buffer (T SS). If neither of the neighbouring cells A1 and A2 are to be programmed, neither of the cells will aggress the even cell T (Table Entry A1=No, A2=No), and the even cell T can be programmed to the final target value of 3V with a 0V delta. This case can be coded by writing the value 00 in the soft state area of the page buffer of even cell T (T SS=00).

If only one of the neighbouring cells A1 or A2 is to be programmed, the even cell T will be aggressed with an intermediate level of coupling (e.g., 80 mV) and the even T can be programmed with a voltage threshold value lower than the target by the intermediate level of coupling (e.g., the value of 2.92V which is 80 mV lower than the final target value of 3V). This case can be coded by writing the value 01 in the soft state area of the page buffer of even cell T (T SS=01). If both the neighbouring cells A1 and A2 are to be programmed, the even cell T will be aggressed with the highest level of coupling (e.g., 160 mV) and the even cell T can be programmed with a voltage threshold value lower than the target by the highest level of coupling (e.g., the value of 2.84V which is 1.60 mV lower than the final target value of 3V). This case can be coded writing the value 11 in the soft state area of the page buffer of even cell T (T SS=11).

In order to properly program the even upper page in cell T and derive the soft states for pre-compensation of even cell T, the user should provide not only the hard states of even upper page for cell T, but also the hard states of the odd upper page of the neighbouring cells A1 and A2 that will be subsequently programmed. The derivation of the two soft bits (T SS in Table 1407) from the 4 hard bits HS UP of A1 and A2 is done internally to the memory. For this reason, this method of pre-compensation can be referred to as "embedded pre compensation."

Conversion table 1408 shows the voltage threshold placement for hard bits HS=10 for even upper page memory cell T in the case where no pre-compensation is used. The final programmed threshold voltage value is directly 3V. Conversion table 1409 shows the voltage threshold placement for hard bits HS=10 for even upper page memory cell T in the case where pre-compensation is used.

All the even upper page T cells having hard states and soft states of HS+SS=1011 will be programmed to a voltage threshold value of 2.84V, and with the contribution due to cell aggression from the neighbouring odd page cells, the even page T cells will appear to reach the target threshold value of 3V. All the even upper page T cells having hard states and soft states of HS+SS=1001 will be programmed to a voltage threshold value of 2.92V, and with the contribution due to cell aggression from the neighbouring odd page cells, the even page T cells will appear to reach the target threshold value of 3V. All the even upper page T cells having hard states and soft states of HS+SS=1000 will be programmed to a voltage threshold value of 3V because it is determined that will not be susceptible to cell aggression from the neighbouring odd page cells.

The techniques of threshold voltage compensation are referred to as pre-compensation because knowledge of the neighbouring cells is used before the memory cell is programmed. Post compensation is a technique of using knowledge of the neighbouring cells when reading cells that have already been programmed. Post compensation can be performed for read operations (e.g., upon user request) and can be completely managed by a controller internal to the memory system. For this reason the technique can be also be referred to as "embedded post compensation."

Post-compensation for potential aggressor memory cells is performed by providing an analog ramp signal to the control gate of a memory cell to be read, and providing a digital representation of the ramp signal to a buffer. The buffer can be selectively coupled to the memory cell to be read. Buffer logic can monitor for when the analog ramp signal causes the cell to be read to conduct, and to latch the digital representation of the signal upon conduction. The digital representation indicates the determined threshold voltage of the cell to be read.

Control logic can include output circuitry that uses the determined threshold voltage, along with the determined state of at least one potential aggressor memory cell physically near the cell to be read to determine a data state based on the determined threshold voltage and an anticipated influence of the determined state of the potential aggressor memory cell. The effects of the potential aggressor memory cell on the determined threshold voltage can therefore be compensated for in determining the data state of the cell, providing more reliable read operation.

Figure 15:
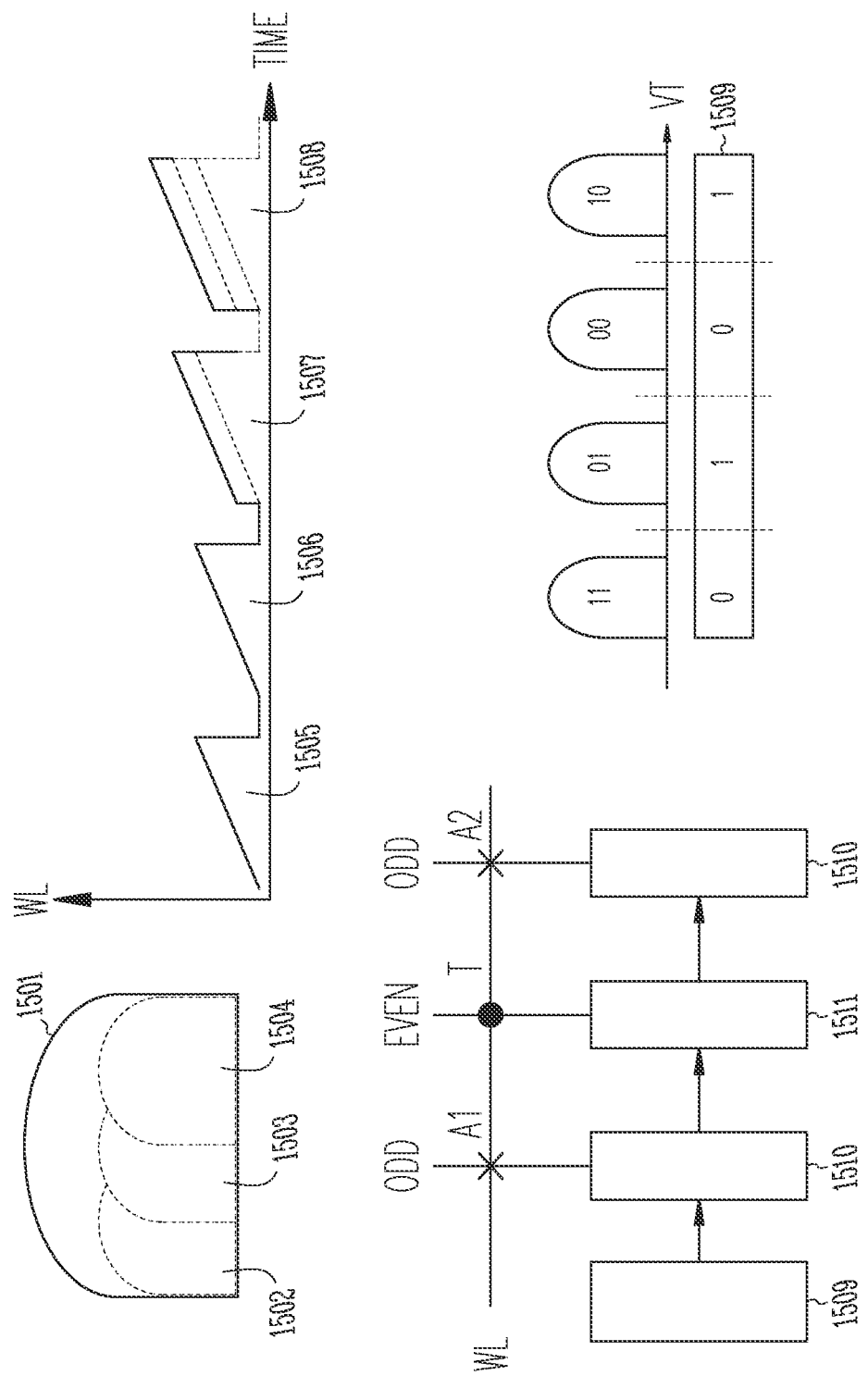
FIG. 15 shows an example of programming a memory system using voltage threshold post compensation, consistent with some example embodiments of the invention.

FIG. 15 shows an example 1500 of post compensation performed on a memory system configured as 2 bits per cell and for the case where even and odd cells have previously been programmed. This example shown relates to post compensation of upper page bits programmed on even cells T. The even cells may have been aggressed by neighbouring upper page programmed in odd cells A1 and A2 that use the same odd page WL. Potential aggression from other diagonal or neighbouring word line cells is not included in the analysis. One voltage threshold distribution 1501 of even UP cells can be the convolution of three categories of even cells: non aggressed cells 1502 that show apparent lowest threshold VT, single sided aggressed cells 1503 that have been aggressed by either left or right neighbouring odd cells and showing intermediate threshold VT, and double sided aggressed cells 1504) that have been aggressed by both left and right odd neighbouring cells and showing the highest apparent threshold VT.

The post compensation technique in the example 1500 can include four phases (shown in the upper right of the Figure as 1505, 1506, 1507, and 1508). The first phase 1505 includes a ramp sensing of the odd cells (e.g., A1 and A2) on the word line WL to identify any odd cells that are aggressors. The aggressor may be those cells that were programmed to one of the aggression levels (e.g., 01 or 10). During the first phase a conversion table 1509 can be used to mark or otherwise indicate whether or not an odd cell is an aggressor. For instance, if an odd cell is programmed to 01 or 10, it is marked as an aggressor (e.g., with a 1) otherwise it is marked as a non-aggressor (e.g., with a 0). This aggression information can be written into the corresponding odd page buffers 1510. An internal controller can use the aggression information to write a code into the even cell page buffer 1511 to indicate whether the even cell is not aggressed (00), single sided aggressed (01), or double sided aggressed (11). In some examples, the conversion table can include hard and soft bits, and the aggression information is encoded using the soft bits of information. In further examples, hard bits reflect the data state corresponding to the determined threshold voltage, while soft bits reflect the deviation from the expected threshold voltage for the data state associated with the determined threshold voltage. Output compensation circuitry can use the soft bits to determine a distance from the center of a voltage distribution for a data state indicated by the one or more hard bits. This can be used to adjust the voltage ramp signal during sensing of the memory cell.

The second phase 1506 includes regular ramp sensing of the even cells on the word line WL. Only the non-aggressed cells are enabled to be sensed during the second phase. This results in only portion 1502 of total distribution 1501 being read.

The third phase 1507 includes a ramp read of even cells on the word line WL. Only the single sided aggressed cells are enabled to be sensed during the third phase, so only portion 1503 of the total distribution 1501 is read. The example 1500 shows that during the third phase 1507 the WL ramp is shifted up to a higher voltage ramp compared to the ramp used in the second phase 1506. In some examples, the ramp is shifted using output compensation circuitry. This compensates for the apparent left shift of distribution 1503 of total distribution 1501.

The fourth phase 1508 is a ramp read of even cells on the word line WL and only double sided aggressed cells are enabled to be sensed. This results in only portion 1504 of the total distribution 1501 being read during the fourth phase. The example 1500 shows that the WL ramp is shifted up to higher voltage compared to the shifted ramp used in the third phase 1507. This compensates for the apparent left shift of distribution 1504 of total distribution 1501. The final result after the four phases is that the two distributions 1503 and 1504 are left shifted and the apparent total distribution is not as large as 1501, but is compacted to distribution 1502.

The direction and magnitude derived from the soft bit data are used in a further embodiment for error correction, such as to detect memory cells that deviate significantly from the expected threshold voltage so that the bits can be corrected, or for error prevention, such as to swap out portions of memory that deviate significantly from expected threshold voltages for other pages or blocks. For instance, an error correction process might identify that two bits are in error but only be able to correct one bit using error correction code data. Soft bit data may be used to determine which bits deviate the most from the desired or expected threshold value and are therefore most likely to be the bits in error. For instance, the soft bit data can be used to determine a number of bits that deviate from the expected threshold value by more than a specified deviation threshold value. This information can be used to correct both bits in error. Error correction may also include replacing the identified memory cells with other memory cells.

Figure 16:
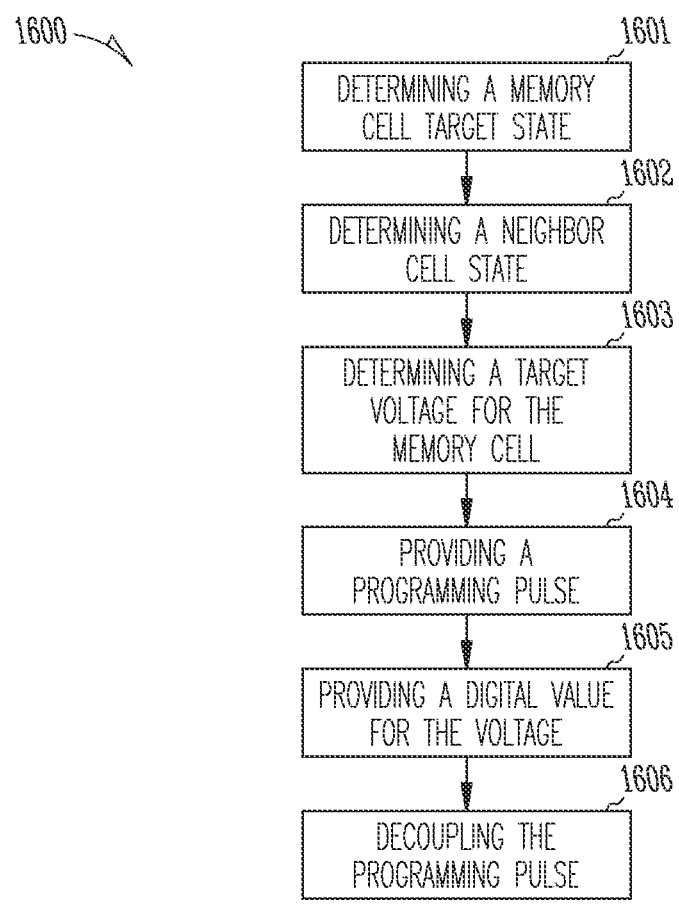
FIG. 16 shows a flow diagram of an example of a method of operating a memory or memory system.

FIG. 16 shows a flow diagram of an example of a method 1600 of operating a memory or memory system. At block 1601, a target data state of at least one memory cell to be programmed is determined. At block 1602, a target data state of at least one potential aggressor memory cell that neighbors the memory cell to be programmed is determined. At block 1603, a target threshold voltage for the cell to be programmed based at least in part on the determined target data state of the at least one potential aggressor memory cell. At block 1604, a programming pulse signal comprising a series of pulses is provided to a control gate of the memory cell to be programmed. At block 1605, a digital representation of the determined target threshold voltage is provided to a buffer coupled to the memory cell. At block 1606, the provided programming pulse signal is decoupled from the control gate of the memory when a read operation confirms that an observed threshold voltage is substantially equal to the determined target threshold voltage.

The method 1600 may further include performing a read operation between at least some of the series of pulses in the programming pulse signal to determine whether the observed threshold voltage is substantially equal to the determined target threshold voltage, such that when the read operation confirms that the observed threshold voltage is substantially equal to the determined target threshold voltage the provided programming pulse signal is decoupled from the control gate of the memory to be programmed before a next pulse in the series of pulses occurs. In certain examples, the potential aggressor memory cells can include cells that neighbor the memory cell to be programmed that have not yet been programmed.

The method 1600 may further include applying the result of the read operation and the determined target threshold voltage to a comparator to determine whether the observed threshold voltage is substantially equal to the determined target threshold voltage.

The method 1600 may further include encoding the target state of the memory cell to be programmed as one or more hard bits of data and a difference between the target state and the determined target threshold voltage as one or more soft bits of data. In certain examples, the one or more hard bits of data include the most significant bits of the target threshold voltage, and the one or more soft bits of data comprise least significant bits of the target threshold voltage.

The method 1600 may further include converting a value of a digital signal corresponding to the analog ramp signal to a converted digital value, the converted digital value to be applied to the buffer and operable to provide a configurable distribution between threshold voltages in the memory cell to be programmed.

According to some embodiments, a method of programming a memory or memory system includes providing an analog ramp signal to a control gate of a memory cell to be read, providing a digital representation of the analog ramp signal to a buffer coupled to the memory cell, monitoring the memory cell to be read for conduction, latching the provided digital representation of the analog ramp signal in the buffer when the memory cell to be read conducts, the latched digital representation indicating a determined threshold voltage of the cell to be read, determining a data state of at least one aggressor nonvolatile memory cell that neighbors a memory cell to be read, and determining an output of a read operation based at least in part on the determined threshold voltage and the determined data state of the potential aggressor memory cell.

In certain examples, the determined threshold voltage includes one or more hard bits of data and one or more soft bits of data, the one or more hard bits comprising most significant bits of the determined threshold voltage, and the one or more soft bits of data comprising least significant bits of the determined threshold voltage. In certain examples, the one or more soft bits indicates a distance from the center of a voltage distribution for a data state indicated by the one or more hard bits.

The method may further include using the one or more soft bits of data to determine a number of bits that deviate from an expected threshold value by more than a specified deviation threshold value in order to perform error correction. In certain examples, the one or more soft bits of data are used to identify memory cells having threshold voltages that deviate from expected threshold values so that the identified memory cells can be replaced with other memory cells. In some examples, the method includes converting a value of a digital signal corresponding to the analog ramp signal to a converted digital value, the converted digital value to be applied to the buffer and operable to provide a configurable distribution.

According to some embodiments, a method of programming a memory or memory system includes adjusting a threshold voltage of a nonvolatile memory cell using voltage placer circuitry to compensate for influence exerted by one or more adjacent aggressor programmed memory cells in achieving a desired threshold voltage.

It should be noted that the methods described herein do not have to be executed in the order described, or in any particular order. Moreover, various activities described with respect to the methods identified herein can be executed in iterative, serial, or parallel fashion. The various elements of each method (e.g., the methods shown in FIG. 16) can be substituted, one for another, within and between methods.

The example systems and methods described herein illustrate how threshold voltages in a flash memory can be controlled in a system that allows threshold voltage placement, to provide more reliable operation and reduce the influence of factors such as neighboring programmed memory cells and parasitic coupling. Pre-compensation and post-compensation of threshold voltage for neighboring programmed "aggressor" memory cells has been shown, reducing the threshold voltage uncertainty in a memory system. Use of a data structure or lookup table to provide programmable threshold voltage distributions was also shown, enabling the distribution of threshold voltages in a multi-level cell flash memory to be tailored to provide more reliable operation. Examples such as these may be incorporated into a memory, a memory controller, electronic devices such as a smart phone or solid state storage, or other such devices.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A method of operating a memory, comprising:
    determining a target data state of at least one memory cell to be programmed;
    determining a target data state of at least one potential aggressor memory cell that neighbors the memory cell to be programmed;
    determining a target threshold voltage for the cell to be programmed based at least in part on the determined target data state of the at least one potential aggressor memory cell;
    providing a programming pulse signal comprising a series of pulses to a control gate of the memory cell to be programmed;
    providing a digital representation of the determined target threshold voltage to a buffer coupled to the memory cell; and
    decoupling the provided programming pulse signal from the control gate of the memory when a read operation confirms that an observed threshold voltage is substantially equal to the determined target threshold voltage.

2. The method of operating a memory of claim 1, further comprising performing a read operation between at least some of the series of pulses in the programming pulse signal to determine whether the observed threshold voltage is substantially equal to the determined target threshold voltage, such that when the read operation confirms that the observed threshold voltage is substantially equal to the determined target threshold voltage the provided programming pulse signal is decoupled from the control gate of the memory to be programmed before a next pulse in the series of pulses occurs.

3. The method of operating a memory of claim 1, wherein the potential aggressor memory cells comprise cells that neighbor the memory cell to be programmed that have not yet been programmed.

4. The method of operating a memory of claim 1, further comprising applying the result of the read operation and the determined target threshold voltage to a comparator to determine whether the observed threshold voltage is substantially equal to the determined target threshold voltage.

5. The method of operating a memory of claim 1, further comprising encoding the target state of the memory cell to be programmed as one or more hard bits of data and a difference between the target state and the determined target threshold voltage as one or more soft bits of data.

6. The method of operating a memory of claim 5, wherein the one or more hard bits of data comprise most significant bits of the target threshold voltage, and the one or more soft bits of data comprise least significant bits of the target threshold voltage.

7. The method of operating a memory of claim 1, further comprising converting a value of a digital signal corresponding to the analog ramp signal to a converted digital value, the converted digital value to be applied to the buffer and operable to provide a configurable distribution between threshold voltages in the memory cell to be programmed.

8. A method of operating a memory, comprising:
    providing an analog ramp signal to a control gate of a memory cell to be read;
    providing a digital representation of the analog ramp signal to a buffer coupled to the memory cell;
    monitoring the memory cell to be read for conduction;
    latching the provided digital representation of the analog ramp signal in the buffer when the memory cell to be read conducts, the latched digital representation indicating a determined threshold voltage of the cell to be read;
    determining a data state of at least one aggressor nonvolatile memory cell that neighbors a memory cell to be read; and
    determining an output of a read operation based at least in part on the determined threshold voltage and the determined data state of the potential aggressor memory cell.

9. The method of operating a memory of claim 8, the determined threshold voltage comprising one or more hard bits of data and one or more soft bits of data, the one or more hard bits comprising most significant bits of the determined threshold voltage, and the one or more soft bits of data comprising least significant bits of the determined threshold voltage.

10. The method of operating a memory of claim 9, the one or more soft bits indicating a distance from the center of a voltage distribution for a data state indicated by the one or more hard bits.

11. The method of operating a memory of claim 9, further comprising using the one or more soft bits of data to determine a number of bits that deviate from an expected threshold value by more than a specified deviation threshold value in order to perform error correction.

12. The method of operating a memory of claim 9, further comprising using the one or more soft bits of data to identify memory cells having threshold voltages that deviate from expected threshold values so that the identified memory cells can be replaced with other memory cells.

13. The method of operating a memory of claim 9, further comprising converting a value of a digital signal corresponding to the analog ramp signal to a converted digital value, the converted digital value to be applied to the buffer and operable to provide a configurable distribution.

14. A memory, comprising:
a memory cell to be programmed having a control gate operable to receive a programming signal;
programming logic operable to determine a target data state of at least one potential aggressor memory cell and to determine a target threshold voltage for the memory cell to be programmed, wherein the target threshold voltage is based at least in part on the determined target data state of the at least one potential aggressor memory cell;
a programming signal source operable to provide a programming pulse signal comprising a series of pulses to the control gate of the memory cell to be programmed; and
a buffer operable to store a digital representation of the target threshold voltage for the memory cell to be programmed, wherein the programming logic is operable to inhibit programming of the memory cell when a read operation confirms that an observed threshold voltage is substantially equal to the determined target threshold voltage.

15. The memory of claim 14, wherein the potential aggressor memory cells comprise memory cells that neighbor the memory cell to be programmed that have not yet been programmed.

16. The memory of claim 14, the programming logic further comprising read logic operable to perform a read operation between at least some of the series of pulses in the programming pulse signal to determine whether the observed threshold voltage is substantially equal to the determined target threshold voltage.

17. The memory of claim 16, wherein the read logic is operable to apply a threshold voltage to the control gate of the memory cell to be programmed, and wherein the memory includes a sense amplifier to determine whether the memory cell conducts when the applied threshold voltage is substantially equal to the determined target threshold voltage.

18. The memory of claim 14, the programming logic further operable to encode the target state of the memory cell to be programmed as one or more hard bits of data and encode a difference between the desired target threshold voltage and the threshold voltage actually programmed as one or more soft bits of data.

19. The memory of claim 18, wherein the one or more hard bits of data comprise the most significant bits of a threshold voltage, and the one or more soft bits of data comprise the least significant bits of the threshold voltage.

20. The memory of claim 18, further comprising a conversion table operable to convert a value of a digital signal corresponding to the analog ramp signal to a converted digital value, the converted digital value to be applied to the buffer and operable to provide a configurable distribution between threshold voltages in the memory cell to be programmed.

21. A memory, comprising:
a memory cell to be read having a control gate operable to receive an analog ramp signal;
a buffer operable to receive a digital representation of the analog ramp signal, the buffer further operable to be selectively coupled to the memory cell;
buffer logic operable to monitor the memory cell to be read for conduction and to store the digital representation of the analog ramp signal upon conduction, thereby storing a determined threshold voltage of the memory cell to be read; and
output compensation circuitry operable to determine an output based at least in part on the determined threshold voltage and an anticipated influence exerted by at least one aggressor memory cell that neighbors the selected memory cell.

22. The memory of claim 21, the determined threshold voltage of the memory cell to be read comprising one or more hard bits of data and one or more soft bits of data, the one or more hard bits comprising a first consecutive group of significant bits of the determined threshold voltage, and the one or more soft bits of data comprising a second consecutive group significant bits of the determined threshold voltage.

23. The memory of claim 22, the output compensation circuitry further operable to use the one or more soft bits to determine a distance from the center of a voltage distribution for a data state indicated by the one or more hard bits.

24. The memory of claim 22, further comprising error correction circuitry operable to determine a number of bits that deviate from an expected threshold value by more than a specified deviation threshold value.

25. The memory of claim 22, further comprising control circuitry operable to identify memory cells that deviate from expected threshold values using the one or more soft bits of data, and to replace the identified memory cells with other memory cells.

26. The memory of claim 23, wherein the output compensation circuitry is operable to adjust the analog ramp signal according to the determined distance from the center of the voltage distribution.

* * * * *